United States Patent
Oshima et al.

(10) Patent No.: US 9,821,406 B2
(45) Date of Patent: Nov. 21, 2017

(54) JOINTED BODY, METHOD FOR MANUFACTURING SAME AND JOINTED MEMBER

(71) Applicant: KABUSHIKI KAISHA TOYOTA CHUO KENKYUSHO, Nagakute-shi, Aichi (JP)

(72) Inventors: Tadashi Oshima, Nagakute (JP); Hisaaki Takao, Seto (JP); Hirofumi Ito, Nagoya (JP)

(73) Assignee: KABUSHIKI KAISHA TOYOTA CHUO KENKYUSHO, Nagakute (JP)

( * ) Notice: Subject to any disclaimer, the term of this patent is extended or adjusted under 35 U.S.C. 154(b) by 306 days.

(21) Appl. No.: 14/370,931

(22) PCT Filed: Mar. 1, 2013

(86) PCT No.: PCT/JP2013/055742
§ 371 (c)(1),
(2) Date: Jul. 7, 2014

(87) PCT Pub. No.: WO2013/141003
PCT Pub. Date: Sep. 26, 2013

(65) Prior Publication Data
US 2015/0044496 A1     Feb. 12, 2015

(30) Foreign Application Priority Data

Mar. 23, 2012   (JP) .................................. 2012-068476

(51) Int. Cl.
*B23K 20/10*   (2006.01)
*B32B 15/01*   (2006.01)
(Continued)

(52) U.S. Cl.
CPC ................ *B23K 20/10* (2013.01); *B32B 7/04* (2013.01); *B32B 15/01* (2013.01); *H01L 24/80* (2013.01);
(Continued)

(58) Field of Classification Search
CPC ...................................................... B32B 15/01
(Continued)

(56) References Cited

U.S. PATENT DOCUMENTS 5,297,937 A * 3/1994 Umetani ................. F01D 5/147
                                                       416/232
5,693,203 A * 12/1997 Ohhashi .............. C23C 14/3407
                                                       204/298.12
(Continued)

FOREIGN PATENT DOCUMENTS

EP         2315240          *  4/2011
JP         A-9-209136          8/1997
(Continued)

OTHER PUBLICATIONS

Japanese Office Action issued in Japanese Patent Application No. 2012-068476 dated Oct. 28, 2014 (with translation).
(Continued)

*Primary Examiner* — Humera Sheikh
*Assistant Examiner* — Lucas Wang
(74) *Attorney, Agent, or Firm* — Oliff PLC

(57) ABSTRACT

A jointed body that has been solid-phase jointed at normal temperature and that has a non-conventional structure is presented. The jointed body is formed by solid-phase joining a first jointed member to a second jointed member, and has a junction interface between the first member and the second member. This jointed body includes an average crystal grain size in a near interface structure that constitutes a near interface area having a total width of 20 micrometers and
(Continued)

SAMPLE A1 extending at both sides of the junction interface as a center is 75-100% of an average crystal grain size in an around interface structure that constitutes around interface areas located at both outer sides of the near interface area. In the jointed body, the near interface structure after the joining is almost the same as the structure before the joining, allowing the jointed body to exert similar characteristics to the jointed members.

9 Claims, 13 Drawing Sheets

(51) Int. Cl.
    *B23K 20/12* (2006.01)
    *H01L 23/00* (2006.01)
    *B32B 7/04* (2006.01)

(52) U.S. Cl.
    CPC .............. *H01L 24/81* (2013.01); *H01L 24/83* (2013.01); *B32B 2250/02* (2013.01); *B32B 2311/24* (2013.01); *H01L 2224/16227* (2013.01); *H01L 2224/80205* (2013.01); *H01L 2224/80365* (2013.01); *H01L 2224/80385* (2013.01); *H01L 2224/81205* (2013.01); *H01L 2224/81365* (2013.01); *H01L 2224/81385* (2013.01); *H01L 2224/83205* (2013.01); *H01L 2224/83365* (2013.01); *H01L 2224/83385* (2013.01); *H01L 2924/12042* (2013.01); *Y10T 428/12472* (2015.01)

(58) Field of Classification Search
    USPC .................................................. 428/650–654
    See application file for complete search history.

(56) References Cited

U.S. PATENT DOCUMENTS

| 5,807,443 A | 9/1998 | Masuda et al. |
| 2005/0145306 A1* | 7/2005 | Statnikov .............. B06B 1/0253 |
| | | 148/508 |
| 2006/0085965 A1 | 4/2006 | Suga et al. |

FOREIGN PATENT DOCUMENTS

| JP | B2-2791429 | 8/1998 |
| JP | A-2000-343240 | 12/2000 |
| JP | A-2001-73129 | 3/2001 |
| JP | A-2004-119430 | 4/2004 |
| JP | 2004-179484 A | 6/2004 |
| JP | A-2005-254324 | 9/2005 |
| JP | A-2008-214704 | 9/2008 |
| JP | B2-4212641 | 1/2009 |
| JP | A-2009-220151 | 10/2009 |
| JP | B2-4686377 | 5/2011 |
| JP | A-2011-235300 | 11/2011 |
| WO | WO 2009/034654 A1 | 3/2009 |

OTHER PUBLICATIONS

International Search Report issued in International Patent Application No. PCT/JP2013/055742 dated May 21, 2013.

Apr. 12, 2016 Office Action dated Japanese Patent Application No. 2012-068476.

Electronics Bonding Technology Editing Committee, "Electronics Bonding Technology", Kogyo Chosakai Publising Co. Ltd, First Edition, p. 65, Mar. 30, 1994.

* cited by examiner

SAMPLE A1

SAMPLE A2

SAMPLE A4

SAMPLE A1

SAMPLE A2

SAMPLE A4

SAMPLE A1        100 μm

SAMPLE A1        10 μm

SAMPLE B1    1mm

SAMPLE B1    0.1mm

SAMPLE C1                    20nm

SAMPLE C1                    5nm

SAMPLE A1 : REFLECTED ELECTRON IMAGE

SAMPLE A1 : ORIENTATION MAP

SAMPLE A1 : STRAIN DISTRIBUTION MAP

SAMPLE B1 : REFLECTED ELECTRON IMAGE

SAMPLE B1 : ORIENTATION MAP

SAMPLE B1 : STRAIN DISTRIBUTION MAP

SAMPLE A1 : COMPO IMAGE

SAMPLE B1 : COMPO IMAGE

Junction interface

50um

20nm

JOINTED BODY, METHOD FOR MANUFACTURING SAME AND JOINTED MEMBER

TECHNICAL FIELD

The present invention relates to a novel jointed body that has a different structure near the junction interface than those of prior art and a method for manufacturing the same, and further to a jointed member for use in the manufacturing.

BACKGROUND ART

An equipment or a device is configured such that plural members are jointed together. Examples of such joining include mechanical joining such as using a bolt, as well as adhesive bonding, welding, diffusion bonding, and room temperature bonding. Adhesive bonding needs an inclusion such as glue and brazing material, while welding and diffusion bonding need high-temperature heating.

In contrast, room temperature bonding is that which utilizes atomic force (surface energy) possessed intrinsically by surface atoms of members to be bonded and which is performed within a ordinary temperature range (from room temperature to low temperature range). According to the room temperature bonding, strong bonding can be allowed even by a small input energy, so that large heat strain and structural change will be prevented from occurring in the vicinity of the junction interface.

The room temperature bonding occurs when atoms (surface atoms) that constitute surfaces to be bonded (bonding surfaces) of members to be bonded are exposed and close to one another and if attractive force (atomic force) acting between their surface atoms exceeds an internal stress that acts in the opposite direction. Accordingly, the conventional room temperature bonding is performed such that bonding surfaces having good surface roughness and flatness are contacted with each other in a state where films such as oxide films and adsorption films of organic substances have been removed.

More specifically, friction welding and narrowly-defined ultrasonic bonding, etc. are industrially performed. In such cases, mechanical friction removes films such as oxidation films on the bonding surfaces to result in room temperature bonding with assistance by the activation of the surface atoms due to friction heat. In this room temperature bonding, the temperature does not rise to the melting point, but the vicinity of the bonding interface is heated to some extent, so that heat strain and structural change, etc. are likely to occur. In addition, the shape and other features of the jointed members may be restricted because the bonding surfaces must be subjected to ultrasonic vibration while being pressurized together at a high pressure to be bonded.

Other than using the mechanical friction, Patent Literature (PTL) 1 or PTL 2 below and other literature propose a room temperature bonding method in which inert gas beam and/or plasma, etc. are irradiated to bonding surfaces to remove films such as oxidation films on the junction surfaces (pretreatment), and the bonding surfaces are thereafter bonded together in vacuum. In addition, PTL 3 proposes forming hardly-oxidizable thin films of gold (Au) on the bonding surfaces and thereafter promptly performing room temperature bonding in the air.

CITATION LIST

Patent Literature

[PTL 1]
JP Patent No. 2791429
[PTL 2]
JP Patent No. 4686377
[PTL 3]
Japanese Unexamined Patent Application Publication No. 2011-235300

SUMMARY OF INVENTION

Technical Problem

The method as described in PTL 1 or PTL 2 requires high-cost facilities and a number of steps for the pretreatment of the joining surfaces, and the processes from the pretreatment to the joining may have to be performed in ultrahigh vacuum. The method as described in PTL 3 enables joining in the air atmosphere, but may require high-cost pretreatment for forming the thin films on the joining surfaces. Therefore, each method as described in the above PTL is difficult to be industrially utilized.

The present invention has been created in view of such circumstances, and objects of the present invention include providing a jointed body that can be jointed at normal temperature using a method which is easy to be industrially utilized, providing a manufacturing method for the same, and providing a jointed member that is suitable for the manufacturing.

Solution to Problem

As a result of intensive studies to solve such problems and repeating trial and error, the present inventors have newly founded that a member to be bonded having a bonding surface of a specific shape can easily be solid-state bonded even in the air atmosphere. Developing and generalizing this achievement, the present invention has been accomplished as will be described hereinafter.

<<Jointed Body>>

(1) The jointed body according to the present invention is a jointed body that is formed by solid-phase joining a first jointed member to a second jointed member and has a junction interface between the first member and the second member. The jointed body is characterized in that an average crystal grain size (ds) in a near interface structure that constitutes a near interface area having a total width of 20 micrometers and extending at both sides of the junction interface as a center is 75-100% of an average crystal grain size (dm) in an around interface structure that constitutes around interface areas located at both outer sides of the near interface area.

(2) In the case of the jointed body according to the present invention, there is almost no difference between the near interface structure and the around interface structure. That is, the metal structure in and around the vicinity of the joining surfaces of the jointed members is in a state where the state before the joining is maintained even after the joining. Therefore, the jointed body according to the present invention is homogeneous as a whole including the junction interface thereby to exhibit properties possessed intrinsically by the members to be jointed.

<<Manufacturing Method for Jointed Body and Jointed Members>>

(1) Such a jointed body can be obtained by the following manufacturing method according to the present invention, for example. That is, the manufacturing method according to the present invention is a method for manufacturing a jointed body, the method comprising a joining step that obtains the jointed body by solid-phase joining a first jointed member to a second jointed member, and is characterized in that at least one of the first jointed member and the second jointed member comprises a joining surface that has a microasperity shape such that a surface roughness is 0.2 micrometers or less as a maximum height (Rmax) and an actual surface area (S0) is larger by 15% or more than a reference surface area (St) calculated from external dimensions, and the joining step is a normal temperature joining step that joints the first jointed member to the second jointed member via the joining surface in the normal temperature air.

(2) Moreover, the present invention can also be perceived as a jointed member which is used in the manufacturing. That is, the present invention may be a jointed member that has a joining surface to be solid-phase jointed and is characterized in that the joining surface has a microasperity shape such that a surface roughness is 0.2 micrometers or less as a maximum height (Rmax) and an actual surface area (S0) is larger by 15% or more than a reference surface area (St) calculated from external dimensions.

(3) If the jointed member according to the present invention is used, then the normal temperature joining can easily be performed, but the reason for this is not necessarily sure. It appears to be as follow in the present circumstances. First, the jointed member of the present invention is such that the joining surface is formed as a microasperity shape and the actual surface area is thus considerably large. This causes the joining surface to have a significantly large surface energy, and in other words, an unstable state occurs. Of course, if such a joining surface is exposed to the air or the like, then the outermost surface is covered by films such as oxidation films and adsorption films of organic substances, etc. thereby to be provisionally in a stable energy state. As such, even if the joining surfaces according to the present invention are simply contacted with each other or lightly pressurized to be jointed, normal temperature joining will not occur.

However, in a state where the joining surfaces are contacted with each other, if some trigger such as small vibration is applied to between the joining surfaces, then a high surface energy possessed originally by the joining surfaces is released at once. This high surface energy generates a driving force to remove contamination layers (such as oxidation films) which inhibited the joining between the joining surfaces, and the joining between the joining surfaces is thus to be induced spontaneously. In addition, in the case of the members to be jointed of the present invention, the surface roughness of the joining surfaces is good, so that the activated joining surfaces uniformly come close to each other at their entire and the joining easily occurs at the entire area. It thus appears that using the members to be jointed of the present invention allows the jointed body to be obtained such that the members are strongly solid-phase jointed merely by applying a low pressure and/or small vibration, etc. even in the air atmosphere of normal temperature range.

<<Others>>

(1) The shape and material of the jointed member of the present invention are not limited. In addition, the jointed member may be a composite member in which a base material portion and a portion in the vicinity of the joining surface are formed of different materials. The members to be jointed may be formed of the same material, or the same kind of materials or different kinds of materials. For example, the members to be jointed may be formed of the same metal or different metals having different compositions, or a combination of metal and ceramics, etc.

(2) Unless otherwise stated, a numerical range "x to y" as used herein includes the lower limit value x and the upper limit value y. Various numerical values or any numerical value included in numerical ranges described herein may be freely selected or extracted as a new lower limit value or upper limit value, and any numerical range such as "a to b" may thereby be newly provided using such a new lower limit value or upper limit value.

EMBODIMENTS FOR CARRYING OUT THE INVENTION

Figure 1A:
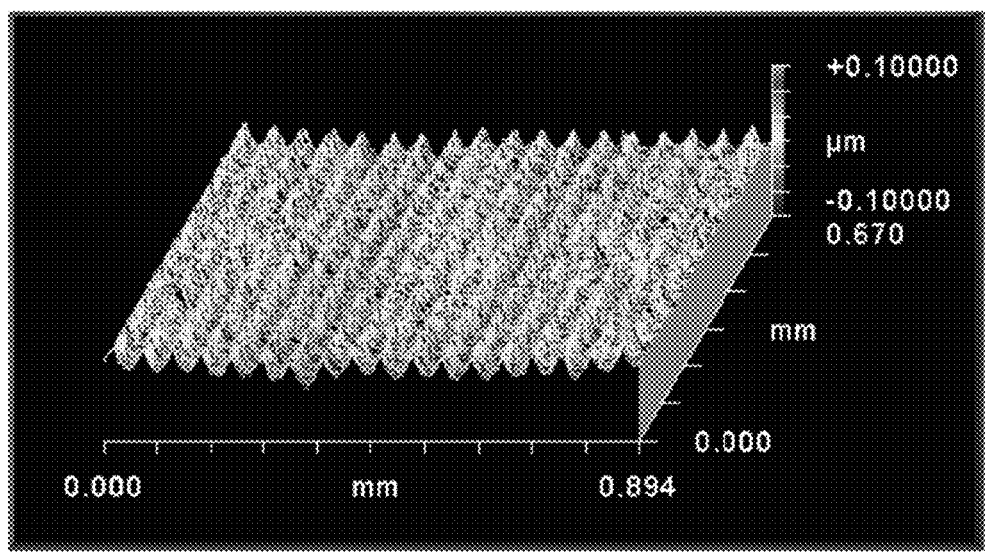
FIG. 1A is a 3D image showing the profile of a joining surface associated with Sample A1.

The content described herein may cover not only the jointed body according to the present invention but a jointed member for use in manufacturing it and further a method for manufacturing them. Features regarding the manufacturing method, when understood as a product-by-process claim, may also be features regarding a product. One or more features freely selected from the description herein may be added to the above-described features of the present invention. Which embodiment is the best or not may be different in accordance with objectives, required performance and other factors.

<<Jointed Body>>

(1) Near Interface Structure and Around Interface Structure

The jointed body according to the present invention is configured such that at least a first jointed member and a second jointed member are solid-phase jointed to each other, and there is almost no structural change between in and around the vicinity of the junction interface. This state is indexed herein by using a crystal grain size ratio ($Z = ds/dm$) that is the fraction of an average crystal grain size (ds) in the near interface structure to an average crystal grain size (dm) in the around interface structure. This crystal grain size ratio is preferably 75% or more, and more preferably 80% or more. It is preferred that the upper limit value of the crystal grain size ratio is 100%.

The average crystal grain size (ds) in the near interface structure is calculated for a near interface area that has a total width of 20 micrometers and is present equally at both sides of the junction interface as a center. On the other hand, the average crystal grain size (dm) in the around interface structure is calculated for around interface areas that are located at both outer sides of the near interface area. More specifically, the around interface areas are defined as both areas that have a width of 10 micrometers and are separated from the junction interface by 10-20 micrometers in the both sides directions. Further, the above average crystal grain size (dm) in the around interface structure is obtained as an arithmetic average value of an average crystal grain size (dm1) in an around interface area that is located at the side of the first member and an average crystal grain size (dm2) in an around interface area that is located at the side of the second member ($dm = (dm1 + dm2)/2$).

As will be understood, even in the jointed body according to the present invention, a very thin joining layer (interface structure) having a width of 5-10 nm or so can exist at the junction interface. In a strict sense, this joining layer is considered to be excluded from the above near interface structure. However, the thickness of this joining layer is considerably smaller than the width and the crystal grain size of the above each area. Therefore, ignoring substantially this joining layer to specify the above-described average crystal grain sizes and crystal grain size ratio does not cause any problem. More specific method for measuring or calculating each average crystal grain size will be described later.

(2) Interface Structure

As described above, a very thin joining layer may exist at the junction interface of the present invention to such an extent that an average electron microscope cannot observe it. The interface structure that constitutes this junction interface can include at least an amorphous oxide phase. This amorphous oxide phase appears to be originated from oxide films that covered the joining surfaces before the joining. As will be understood by a person skilled in the art, if the jointed body is subjected to heating and the like after the joining, then the amorphous oxide phase may become crystalline, and/or the oxygen (O) that constituted the amorphous oxide phase may diffuse into or form solid solution or the like in the near interface structure, etc. to disappear from the amorphous oxide phase. Therefore, the interface structure is not essential for the jointed body according to the present invention.

(3) Material

Material that constitutes the jointed body of the present invention and therefore constitutes the members to be jointed is not limited. Note, however, that the members to be jointed of the present invention may preferably be formed of metal material which is considered in general to be difficult in the joining in a low temperature range, unlike resin materials, etc. It is preferred that at least the vicinity of the joining surface, and further the near interface structure and the around interface structure, are formed of metal.

Examples of such metal include aluminum (Al), copper (Cu), gold (Au), silver (Ag), tin (Sn), nickel (Ni), and alloys thereof. In particular, metals having relatively low elastic modulus (Young's modulus) are preferable because they ensure that the joining surfaces are easily in close contact with each other and jointed at normal temperature.

<<Jointed Member>>

(1) Surface Roughness

The joining surface of the jointed member of the present invention may preferably have a surface roughness of 0.2 micrometers or less, and more preferably 0.1 micrometers or less, as a maximum height (Rmax/JIS). Further, the joining surface may preferably have a surface roughness of 0.02 micrometers or less, and more preferably 0.01 micrometers or less, as a center line average roughness (Ra/JIS). If they are unduly large, then the joining between the joining surfaces may be insufficient. In particular, if the Rmax is unduly large, then a large pressing force is required for causing the joining surfaces to come close, which may not be preferable. In addition, unduly large Ra makes it difficult to uniformly joint the joining surfaces at their entire.

The lower limit value of each surface roughness is not limited so long as the surface area increasing ratio according to the present invention can sufficiently be ensured. Suffice it to say that the Rmax is preferably 0.005 micrometers or more, and more preferably 0.01 micrometers or more. In addition, the Ra is preferably 0.001 micrometers or more, and more preferably 0.005 micrometers or more.

(2) Surface Area Increasing Ratio

The joining surface according to the present invention may preferably have a microasperity shape such that the actual surface area is sufficiently large because as the actual surface area increases, the surface energy also increases to easily induce the normal temperature joining. More specifically, a surface area increasing ratio that is the fraction of the increase in an actual surface area (S0) to a reference surface area (St) calculated from the external dimensions ($deltaS0 = \{100*(S0-St)/S0\}(\%)$) is preferably 15% or more, and more preferably 18% or more. Unduly small surface area increasing ratio cannot facilitate the joining between the joining surfaces. Specific method for measuring the actual surface area, etc. will be described later.

(3) Processing of Joining Surface

Any method for forming the joining surface having the surface roughness and the surface area increasing ratio as described above may be possible, such as, but not limited to, by nano-cutting work, chemical etching, laser texturing, and sputtering, for example. The nano-cutting work may preferably be performed using a single crystal diamond bite with a bite feeding pitch of 50 micrometers or less and a cutting depth of 100 micrometers or less.

(4) Others

The form of the joining surface of the jointed member can be evaluated by wettability other than by the above-described surface roughness and surface area increasing ratio. More specifically, the joining surface falling under the above-described ranges may be such that the contact angle is 13 degrees or less, or further 10 degrees or less.

<<Manufacturing Method for Jointed Body>>

The jointed body according to the present invention can be obtained through a joining step of solid-phase joining a first jointed member to a second jointed member. By using the members to be jointed that have the above-described joining surfaces, this joining step can be performed in the normal temperature air (normal temperature joining step). Of course, the joining step may also be performed in a temperature range other than the normal temperature range or in other atmospheres than the air (such as inert gas atmosphere and vacuum atmosphere).

When the joining is performed in the air or the like, the joining surfaces are in a situation of being contaminated such as by oxide films (situation where the surface atoms are not exposed). Even if such joining surfaces are simply contacted with each other, the normal temperature joining may not be possible in general. In this regard, it is preferred that the joining step (in particular the normal temperature joining step) is a step that applies a vibration to the first jointed member and the second jointed member while the joining surfaces thereof are pressurized and contacted with each other. This allows the contamination layers, such as oxide films and adsorption films remaining on the joining surfaces, to be removed, so that the solid-phase joining (in particular normal temperature joining) can easily progress between the joining surfaces.

The pressurizing between the joining surfaces may be under 30 MPa or less, 20 MPa or less, or further 15 MPa or less or so, for example. Applying the vibration between the joining surfaces can be performed, for example, using ultrasonic vibration, etc. Such ultrasonic vibration may preferably be performed with a vibration frequency of 50 kHz, an output of 100 W or less, and a vibration time of 2 seconds or less.

<<Intended Use>>

The jointed body according to the present invention can be used for various uses without any limitation, and the joining method according to the present invention can be used for joining of various components, apparatuses, and devices, etc. For example, the joining according to the present invention may preferably be utilized for joining of electronic components (e.g. joining between bumps of semiconductor chips and wiring layers of a substrate, and joining between laminated substrates). In particular, it is preferred that the jointed body according to the present invention is a high-density packaging component for cars, etc, a next generation power module or the like. By using the jointed body according to the present invention, joining materials such as soldering may be unnecessary, and efficient joining (or mounting) can thus be possible. Moreover, the jointed body according to the present invention is also excellent in recyclability, etc. because of not using joining materials.

EXAMPLES

Examples will be mentioned to more specifically describe the present invention.

<<Manufacturing of Samples>>

<Samples A1-A4>

(1) Jointed Member

Pure aluminum plates were prepared as base materials. Surfaces of these base materials were subjected to various pre-treatments as shown in Table 1 to provide materials under test (members to be jointed).

Nano-cutting work shown in Table 1 was performed as follows. Using a surface grinder (available from Nagase Integrex Co., Ltd.) equipped with a single crystal diamond bite, the work was performed without lubrication oil under a room temperature of 23±1 degrees C. Finishing was accomplished with a bite feeding pitch of 50 micrometers and a cutting depth of 0.01 micrometers.

Polishing was performed using an automatic polishing machine (EcoMet 3 available from Buehler, An ITW Company). In Table 1, #1200 means that the polishing was performed using a waterproof abrasive paper (grain size of 1200), #2000 means that the polishing was performed using a waterproof abrasive paper (grain size of 2000), and "mirror surface" means that the polishing was performed using colloidal silica.

(2) Joining Step

Figure 12:
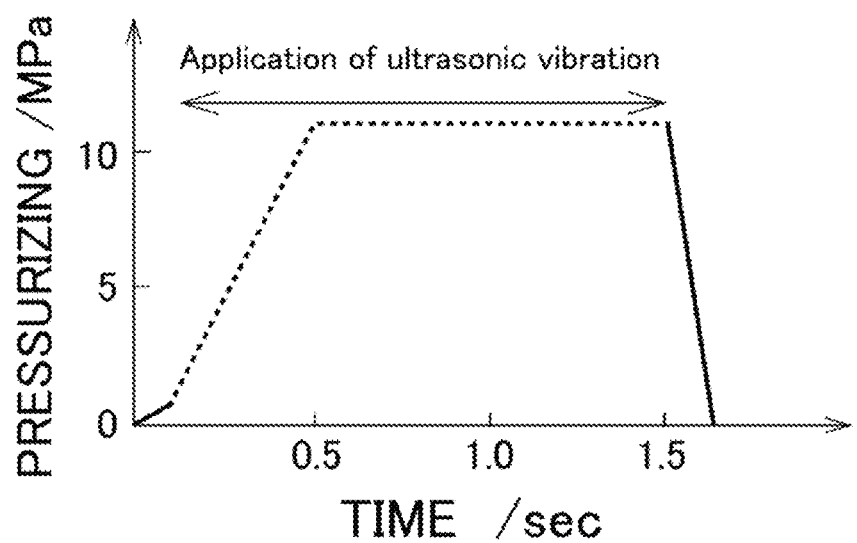
FIG. 12 is a time chart for the pressurizing and the ultrasonic application associated with the joining step.

Normal temperature joining was tried between working surfaces (joining surfaces) of materials under test subjected to the same pre-treatment. This joining was performed in the atmosphere shown in Table 1 (room temperature air) by applying ultrasonic vibration to both the working surfaces while pressurizing them. A flip chip bonder (FC2000 available from Toray Engineering Co., Ltd.) was used for applying ultrasonic vibration. The pressurizing force at that time was up to 10 MPa. Ultrasonic of 50 kHz and amplitude of 5 micrometers was applied during about 1.5 seconds under control of the vibration time in a state where the pressurizing was performed. Specific time chart for the pressurizing and the ultrasonic application is as shown in FIG. 12.

<Samples B1 and C1>

(1) Sample B1

Joining surfaces of the previous-described materials under test formed of pure aluminum were contacted with each other in the atmosphere shown in Table 1 (room temperature air) and applied thereto with ultrasonic vibration while being pressurized as shown in Table 1. Before the joining, acetone cleaning for degreasing was performed as a pre-treatment for the surfaces of the materials under test. The application of ultrasonic vibration at that time was performed using an ultrasonic joining apparatus under a condition of 15 kHz, amplitude of 53 micrometers and a vibration time of 1 second.

(2) Sample C1

Joining surfaces of the previous-described materials under test formed of pure aluminum were contacted with each other in the atmosphere shown in Table 1 (ultrahigh vacuum atmosphere) and pressurized as shown in Table 1. Before the joining, surface cleaning was performed using argon (Ar) ion beam as a pre-treatment for the surfaces of the materials under test. The above-described joining surfaces were contacted with each other and pressurized without being exposed to the air, etc. after the pre-treatment. During this pressurizing, the application of ultrasonic vibration or the like was not performed.

<<Observation and Measurement>>

(1) Jointed Member

Figure 1B:
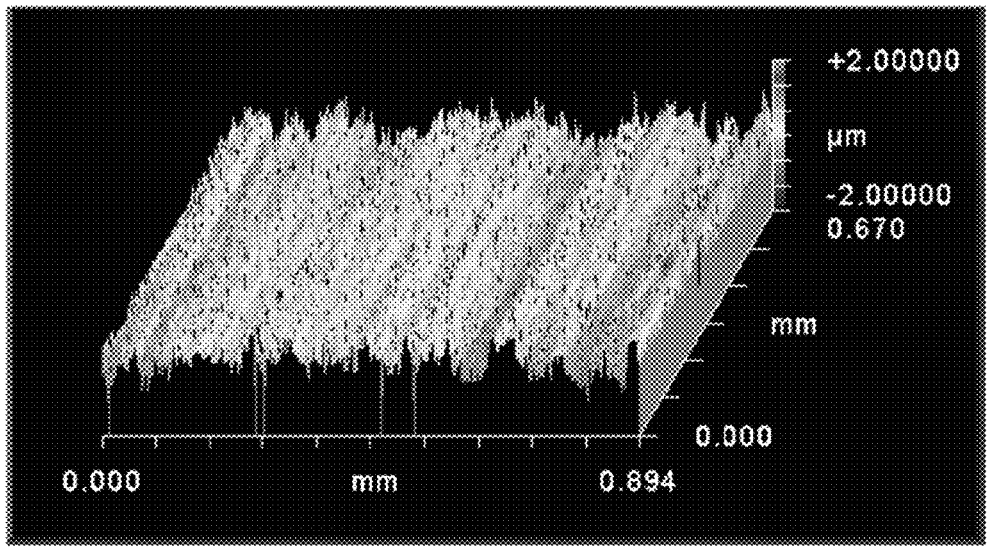
FIG. 1B is a 3D image showing the profile of a joining surface associated with Sample A2.
Figure 1C:
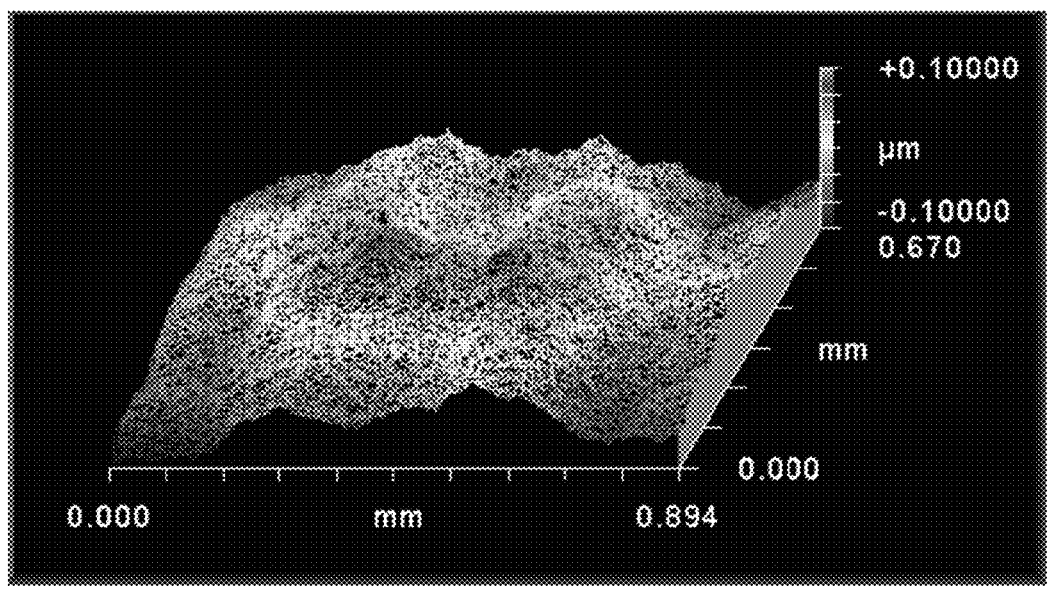
FIG. 1C is a 3D image showing the profile of a joining surface associated with Sample A4.

Appearances of surfaces (joining surfaces) of respective materials under test before the joining step were observed using a non-contact 3D optical surface profiler (ZYGO NewView5022 available from Canon Inc.) and are shown in FIGS. 1A-1C (referred collectively to as FIG. 1). In addition, the surface roughness Rmax and Ra of each joining surface were measured in accordance with JIS B0601-2001. Results thereof are also shown in Table 1.

Further, the actual surface area (S0) as the surface area of the joining surface of each material under test was measured using a non-contact 3D optical surface profiler (ZYGO NewView5022 available from Canon Inc.) and a scanning probe microscope (SPM9500J3 available from SHIMADZU CORPORATION). This joining surface was assumed as an ideal flat surface, and the surface area increasing ratio (deltaS0:%), i.e., the fraction of the increase in the actual surface area to a reference surface area (St) calculated from the external dimensions, was calculated. Results thereof are also shown in Table 1.

(2) Jointed Body

Figure 2A:
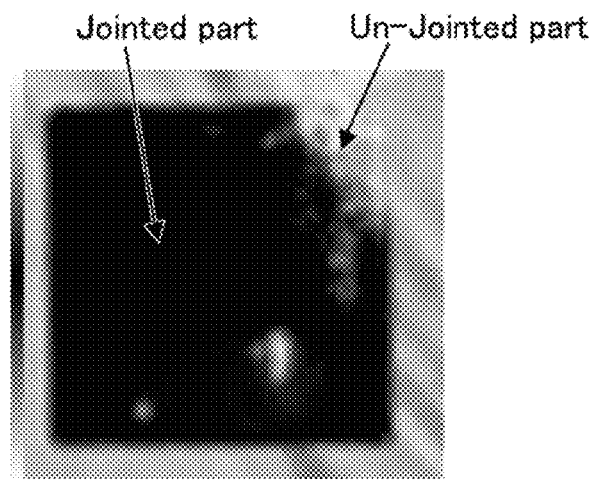
FIG. 2A is a photograph of an ultrasonic microscope image showing the junction interface associated with Sample A1.
Figure 2B:
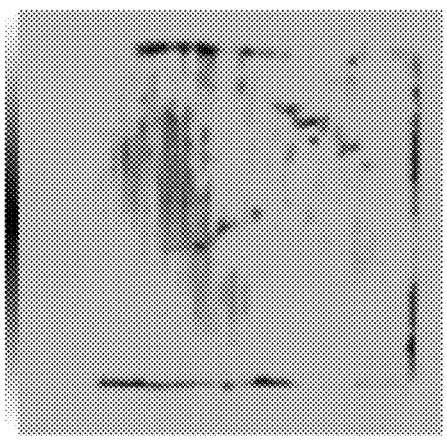
FIG. 2B is a photograph of an ultrasonic microscope image showing the junction interface associated with Sample A2.
Figure 2C:
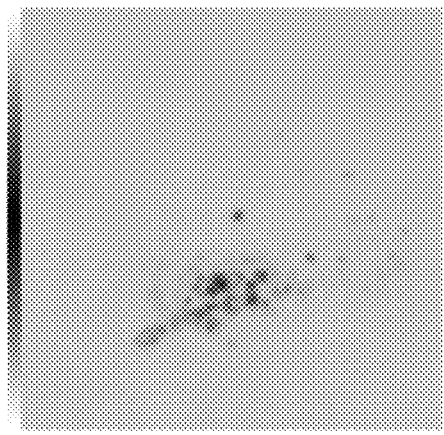
FIG. 2C is a photograph of an ultrasonic microscope image showing the junction interface associated with Sample A4.

Appearances of the junction interfaces of respective jointed bodies obtained by joining the materials under test were observed using an ultrasonic microscope (D9500S available from Sonoscan Inc.) and are shown in FIGS. 2A-2C (referred collectively to as FIG. 2).

Figure 3:
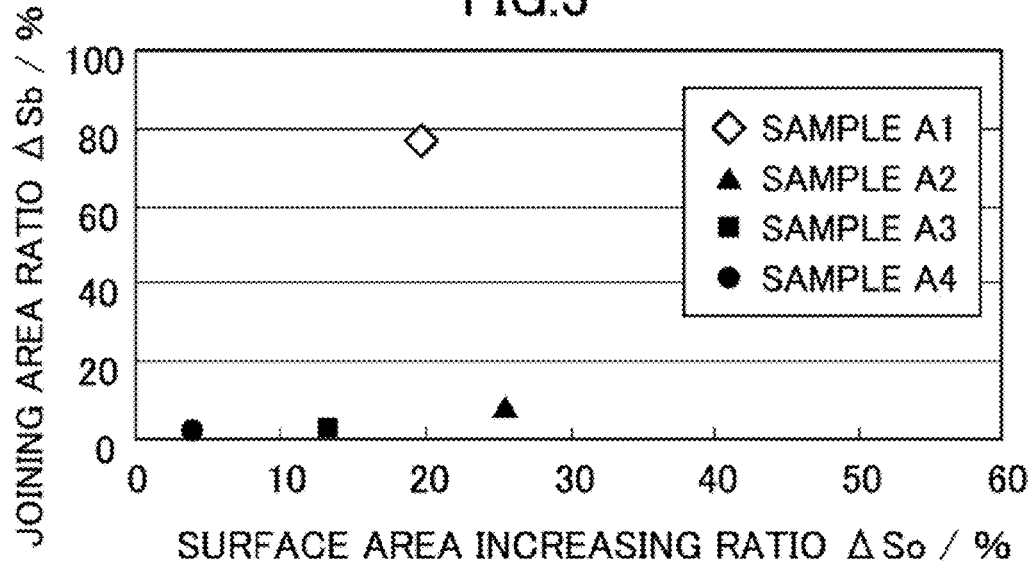
FIG. 3 is a dispersion diagram showing the relationship between the surface area increasing ratio and the joining area ratio associated with each sample.

In addition, an actual joining area (Sb) as the surface of a part actually jointed in each junction interface of the materials under test was measured using an image processing analyzer (LUZEX AP available from NIRECO CORPORATION). Further, a joining area ratio (deltaSb=100*Sb/St (%)), i.e., the fraction of the actual joining area to the reference surface area (St), was calculated. Results thereof are also shown in Table 1. Furthermore, the relationship between the surface area increasing ratio (deltaS0) and the joining area ratio (deltaSb) is shown in FIG. 3.

Figure 4A:
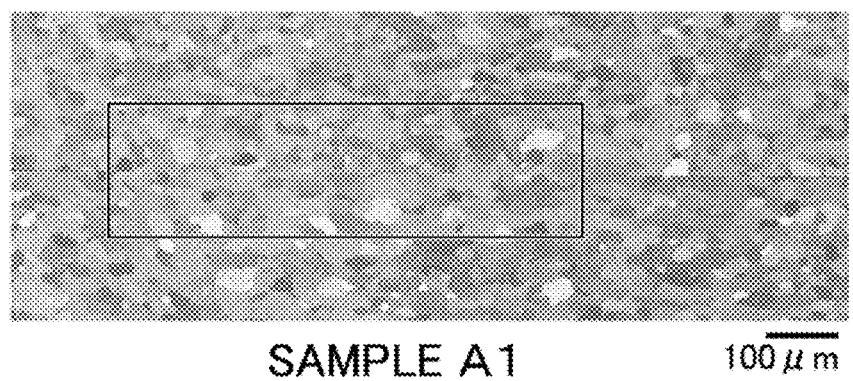
FIG. 4A is a COMPO image showing a cross-section of the jointed body associated with Sample A1.
Figure 4B:
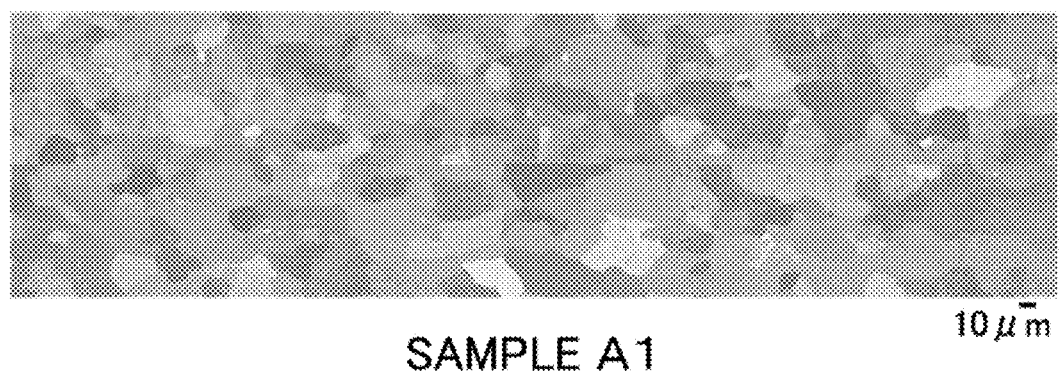
FIG. 4B is an enlarged COMPO image showing a part of the above.

The cross-section (in the vicinity of the junction interface) of the materials under test associated with Sample A1 was observed using a scanning electron microscope (SEM). The obtained composition image (COMPO image) based on the reflected electron image is shown in FIG. 4A, and the enlarged COMPO image of a part thereof (a part surrounded by the rectangle shown in FIG. 4A) is shown in FIG. 4B (both figures are referred collectively to as FIG. 4).

Figure 5A:
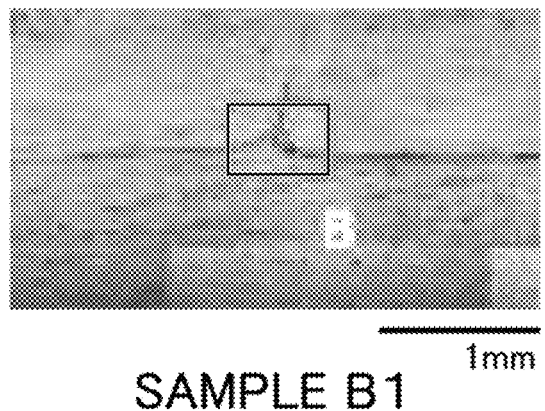
FIG. 5A is a SEM image showing a cross-section of the jointed body associated with Sample B1.
Figure 5B:
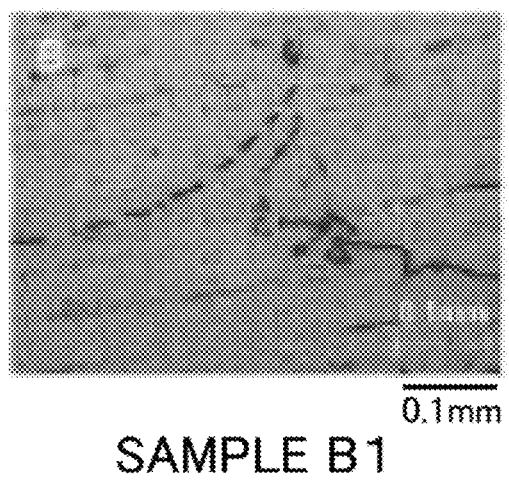
FIG. 5B is an enlarged SEM image showing a part of the above.

The cross-section (in the vicinity of the junction interface) of the materials under test associated with Sample B1 was observed using SEM. The obtained secondary electron image (SEM image) is shown in FIG. 5A, and the enlarged SEM image of a part thereof (a part surrounded by the rectangle shown in FIG. 5A) is shown in FIG. 5B (both figures are referred collectively to as FIG. 5).

Figure 6A:
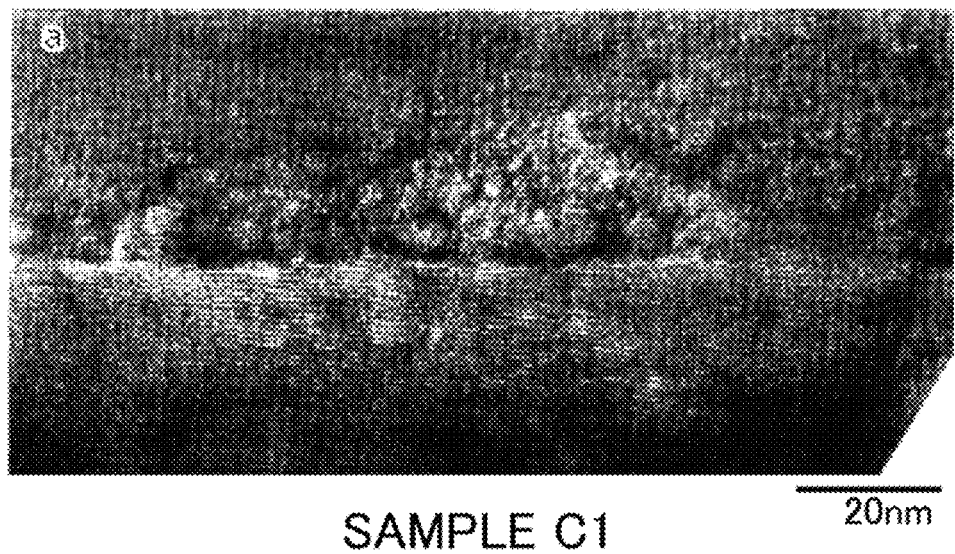
FIG. 6A is a TEM image showing a cross-section of the jointed body associated with Sample C1.
Figure 6B:
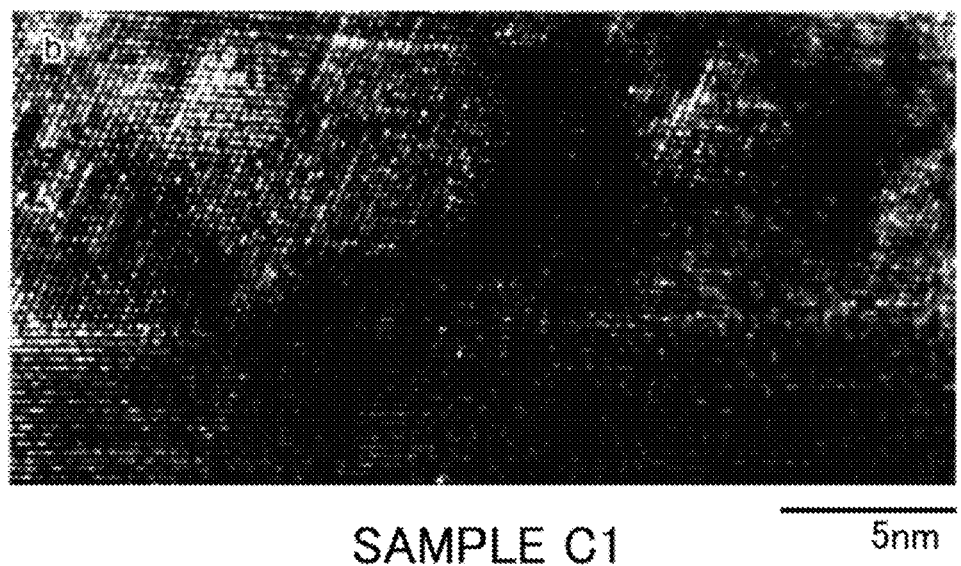
FIG. 6B is an enlarged TEM image showing a part of the above.

The cross-section (in the vicinity of the junction interface) of the materials under test associated with Sample C1 was observed using a transmission electron microscope (TEM). The obtained TEM image is shown in FIG. 6A, and the enlarged TEM image of a central part thereof is shown in FIG. 6B (both figures are referred collectively to as FIG. 6).

Figure 7A:
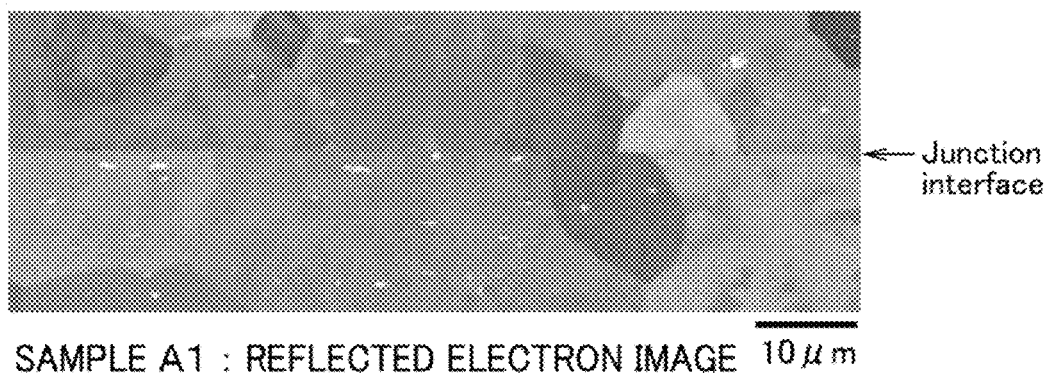
FIG. 7A is a reflected electron image showing a cross-section of the jointed body associated with Sample A1.
Figure 7B:
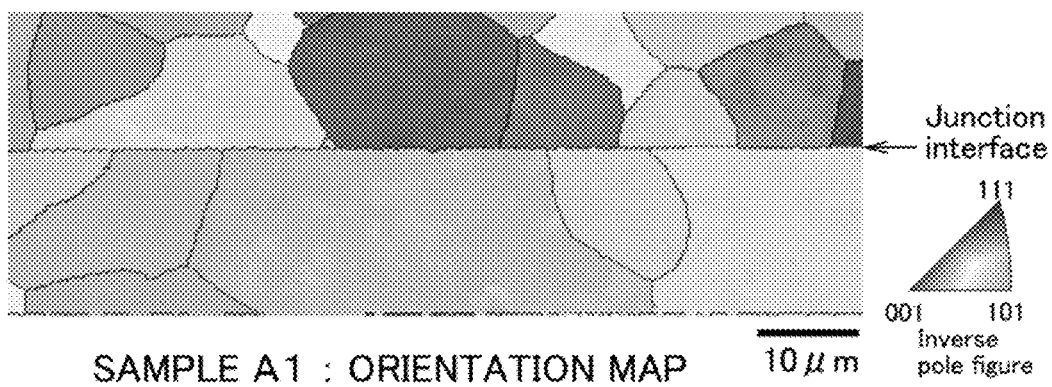
FIG. 7B is an orientation map created based on the above.
Figure 7C:
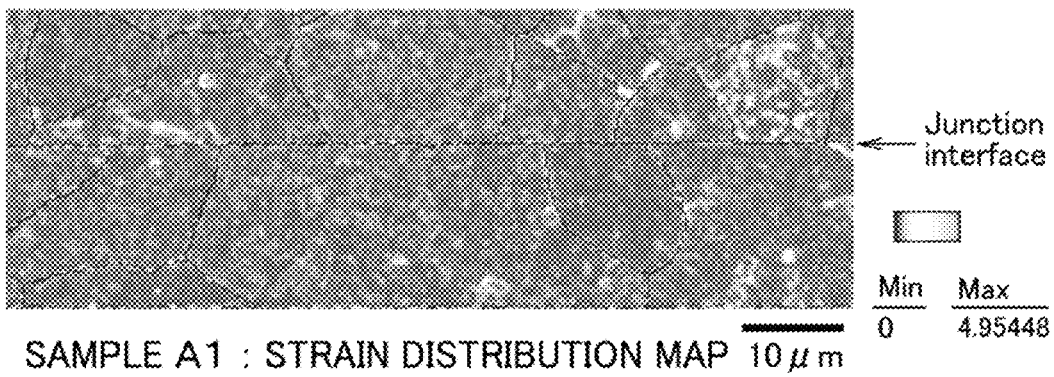
FIG. 7C is a strain distribution map created based on the reflected electron image.

FIG. 7A shows the reflected electron image obtained using SEM to observe the cross-section (in the vicinity of the junction interface) of the materials under test associated with Sample A1. The reflected electron image was used as the basis to create an orientation map and a strain distribution map, which are respectively shown in FIGS. 7B and 7C (FIGS. 7A-7C are referred collectively to as FIG. 7).

Figure 8A:
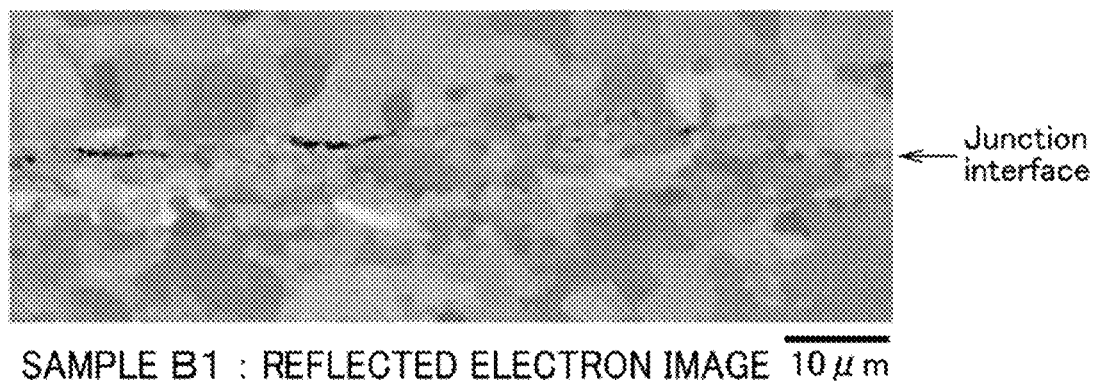
FIG. 8A is a reflected electron image showing a cross-section of the jointed body associated with Sample B1.
Figure 8B:
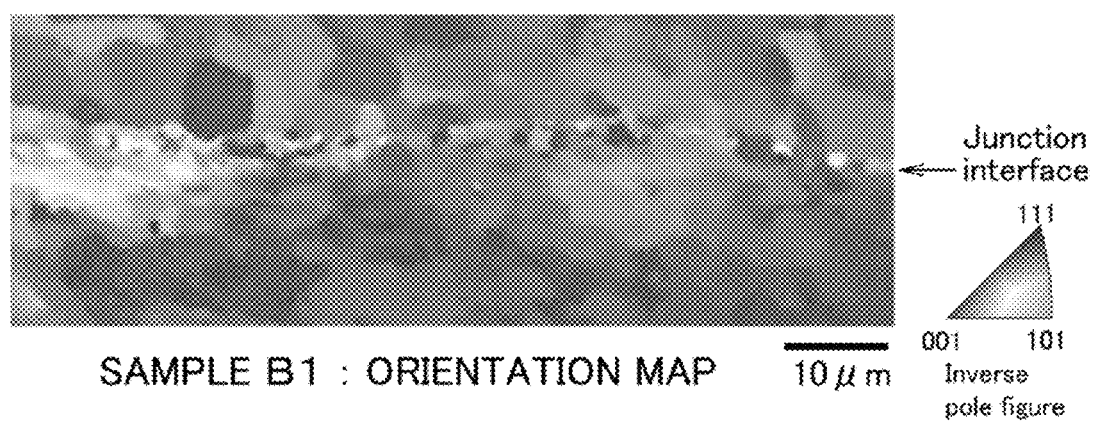
FIG. 8B is an orientation map created based on the above.
Figure 8C:
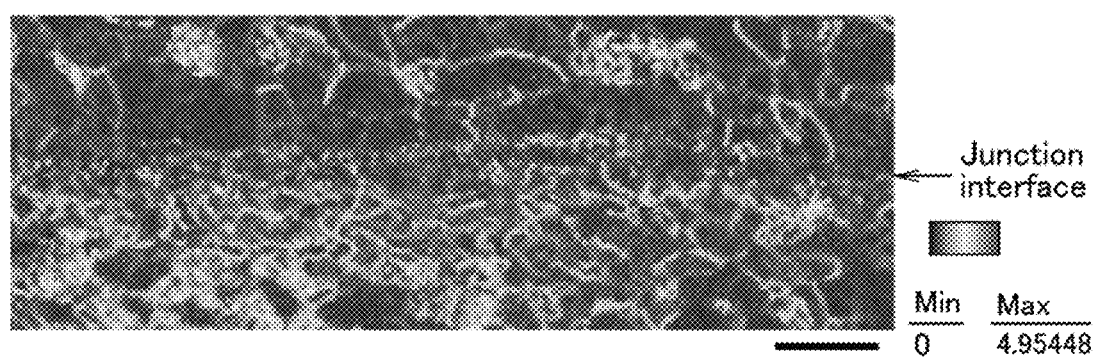
FIG. 8C is a strain distribution map created based on the reflected electron image.

FIG. 8A shows the reflected electron image obtained using SEM to observe the cross-section (in the vicinity of the junction interface) of the materials under test associated with Sample B1. The reflected electron image was used as the basis to create an orientation map and a strain distribution map, which are respectively shown in FIGS. 8B and 8C (FIGS. 8A-8C are referred collectively to as FIG. 8).

Figure 9A:
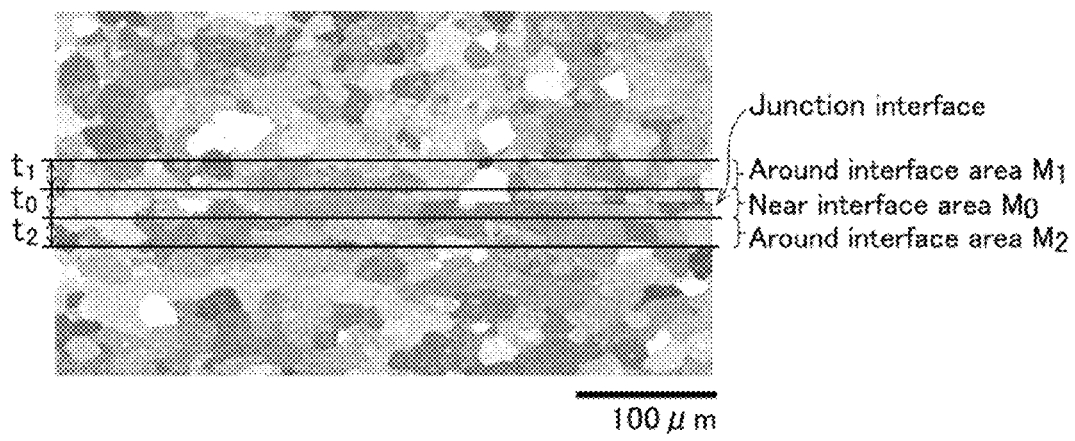
FIG. 9A is a COMPO image showing a cross-section of the jointed body associated with Sample A1 and illustrating areas at which an average crystal grain size is measured.
Figure 9B:
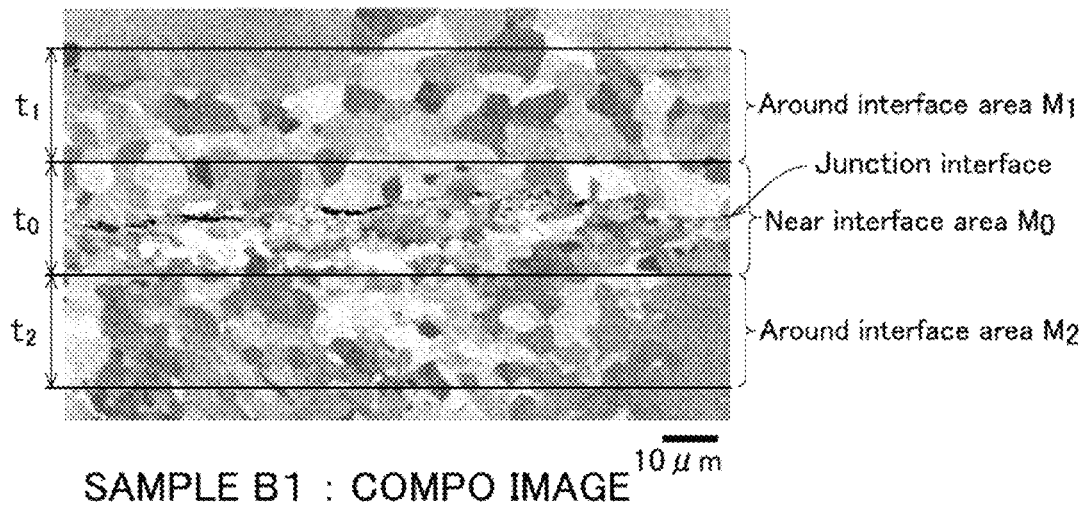
FIG. 9B is a COMPO image showing a cross-section of the jointed body associated with Sample B1 and illustrating areas at which an average crystal grain size is measured.

FIGS. 9A and 9B show the COMPO images obtained using SEM to observe the cross-sections (each in the vicinity of the junction interface) of the materials under test associated with Samples A1 and B1, respectively (both figures are referred collectively to as FIG. 9). The average crystal grain size according to the present invention was calculated on the basis of such COMPO images. More specifically, the average crystal grain size (ds) in the near interface structure was calculated, using a crystal grain size measurement processing provided in the image analysis software, as the size of each crystal grain that constitutes the near interface area M0 having a total width t0 (t0=20 micrometers in the present invention) and extending at both sides of the junction interface, shown in each figure, as a center.

In addition, the average crystal grain size (dm) in the around interface structure was obtained as an arithmetic average value of an average crystal grain size (dm1) in an around interface area M1 and an average crystal grain size (dm2) in an around interface area M2. The "dm1" was calculated, using a similar processing to that for the "ds", as the size of each crystal grain that constitutes the around interface area M1 having a total width t1 (t1=10 micrometers in the present invention) and extending at one side of the near interface area M0 (upper side in the figures). The "dm2" was also calculated, using the same processing as that for the "dm1", for the around interface area M2 having a total width t2 (t2=10 micrometers in the present invention) and extending at the other side of the near interface area M0 (lower side in the figures).

The crystal grain size ratio (Z=ds/dm) associated with each sample was also calculated from each average crystal grain size (ds, dmin). Results thereof are also shown in Table 1. Note that the crystal grain size ratios are presented in percentage terms.

Figure 10A:
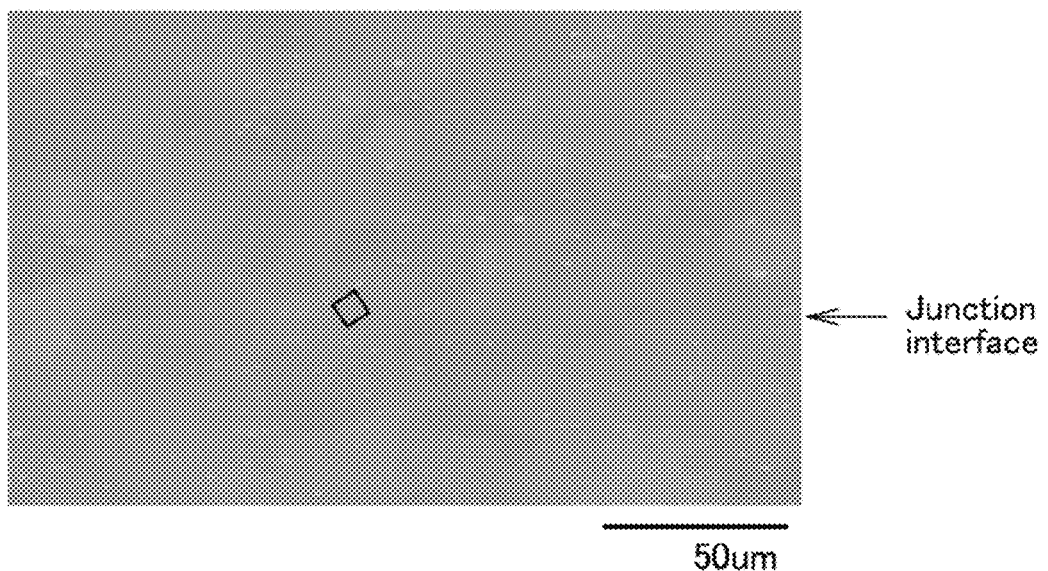
FIG. 10A is a SEM image showing a cross-section of the jointed body associated with Sample A1.
Figure 10B:
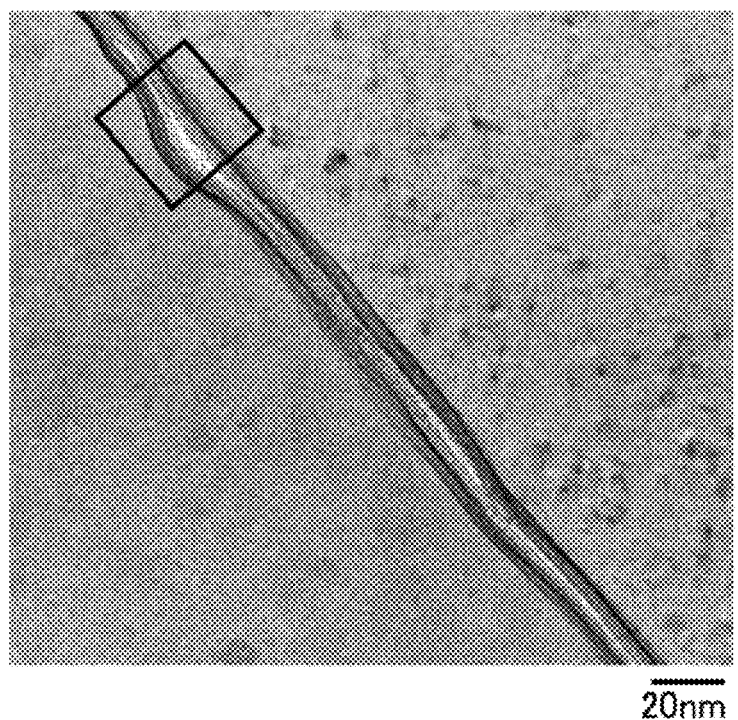
FIG. 10B is an enlarged TEM image showing a part of the above.
Figure 10C:
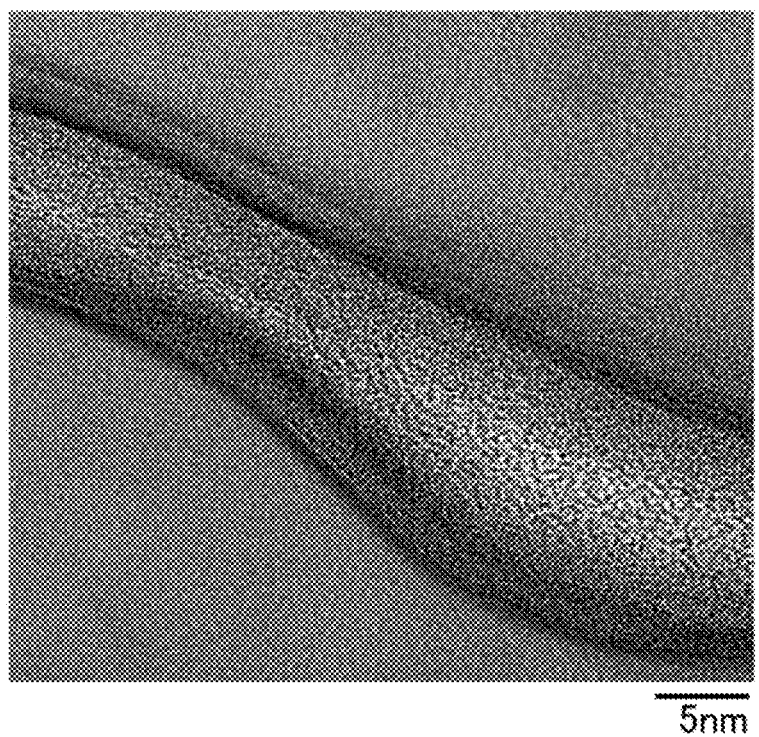
FIG. 10C is a further enlarged TEM image showing a part of the above.

FIG. 10B shows a TEM image obtained using a transmission electron microscope (TEM) to observe a part of the junction interface of the materials under test associated with Sample A1 (the rhombic area in a SEM image shown in FIG. 10A, which was obtained by observing the vicinity of the junction interface), and FIG. 10C shows a further enlarged TEM image of a part of the TEM image (the rhombic area in FIG. 10B).

Figure 11A:
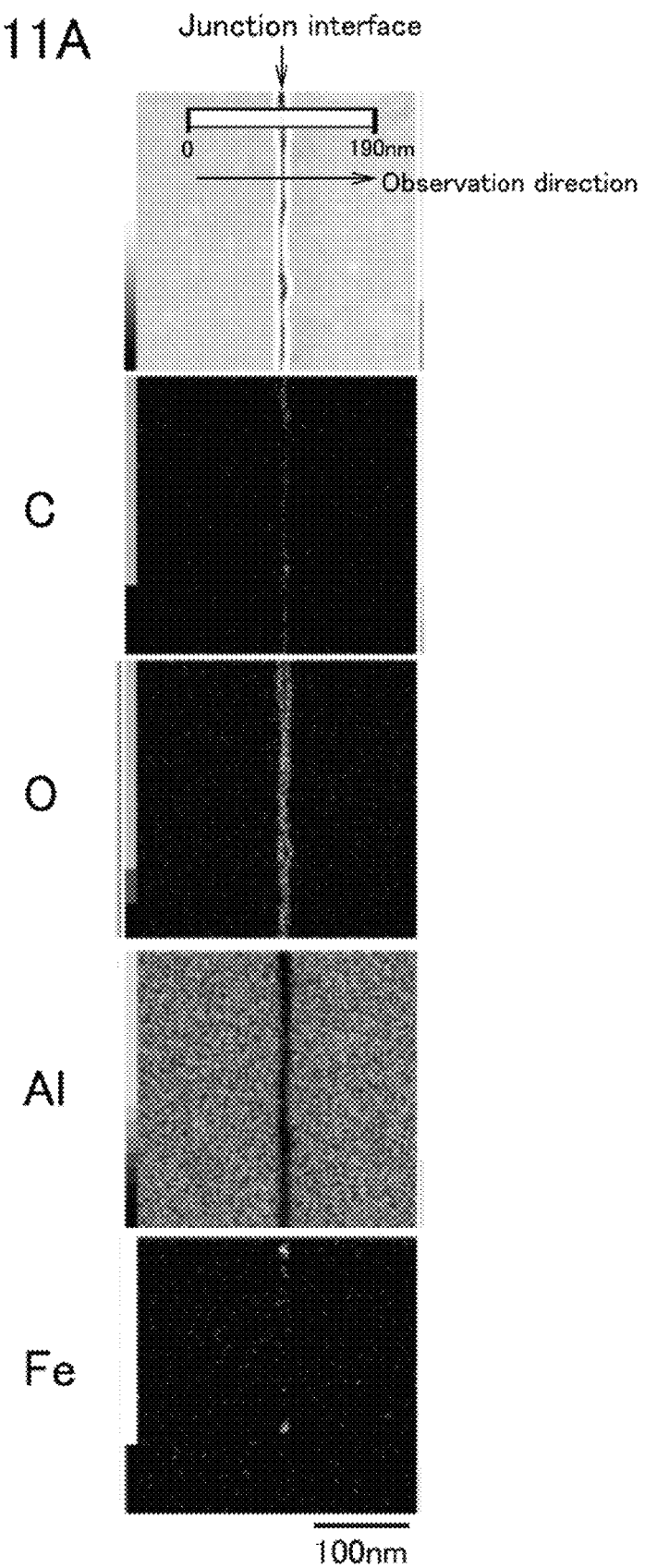
FIG. 11A is a set of EPMA images obtained by observing a cross-section of the jointed body associated with Sample A1.
Figure 11B:
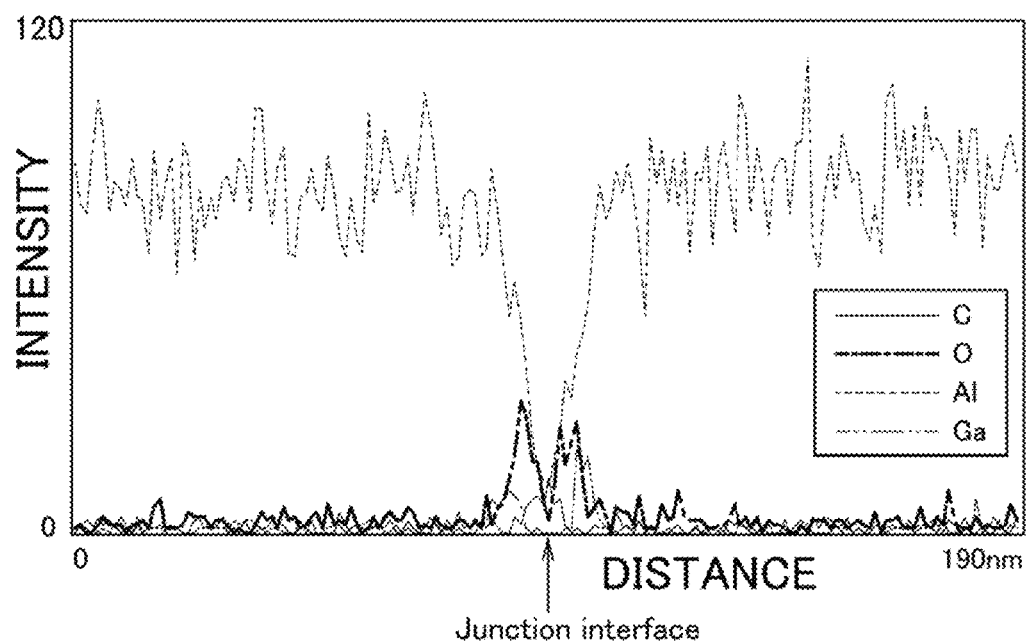
FIG. 11B is an element distribution diagram of the vicinity of the junction interface associated with Sample A1.

FIG. 11A shows results of electron probe microanalysis (EPMA) for the vicinity of the junction interface of the materials under test associated with Sample A1. In addition, FIG. 11B shows each element distribution obtained by observing in the direction across the junction interface as shown in the uppermost photograph in FIG. 11A.

<<Evaluation>>

(1) Joining Ability

As understood from Table 1 and FIGS. 1, 2 and 3, it has been found that the joining surfaces of which the surface roughness and the surface area increasing ratio fall within specific ranges (the case of Sample A1) can have a sufficiently large joining area ratio (deltaSb) simply by the application of ultrasonic vibration while being pressurized with a low pressure in the air, and both materials under test are reliably jointed. In contrast, according to the commonlyused polishing or mirror polishing, it has been found that the joining area ratio (deltaSb) remains at 10% or so at the most regardless of whether the surface area increasing ratio is high or low.

Such results appear to be largely due to effects of the surface profile of the joining surfaces associated with each sample. That is, the joining surfaces associated with Sample A1 have a regular microasperity shape such that the surface roughness and the surface area increasing ratio fall within specific ranges. In contrast, the joining surfaces associated with Sample A2 have an irregular microasperity shape, and in particular the difference in height (Rmax) of the asperity is large. On the other hand, the joining surfaces associated with Sample A4 gently rise and fall so that the surface area increasing ratio is small even though the surface roughness is good. It thus appears that such a difference in forms of the joining surfaces associated with these samples affects significantly the joining ability.

(2) Structure

As understood from each average crystal grain size (dm, ds) and crystal grain size ratio (Z=ds/dm) shown in FIGS. 4-9 and Table 1, the near interface structure in the case of Sample A1 remains almost unchanged before and after the joining. In addition, the junction interface was a flat surface (straight line in the cross-section) to which the joining surfaces of the materials under test were mostly reflected without any change.

joining layer was confirmed to comprise an amorphous phase by observation using a transmission electron microscope (TEM).

As understood from FIG. 11, it has also been found that the joining layer contains a relatively large amount of Al as well as O and C. It appears that O is derived from oxide films ($Al_2O_3$ films) attached to the surfaces before the joining and C is from contamination (contamination phases). It should be noted that the reason why a small amount of Ga is detected as shown in FIG. 11B is that the sample surfaces lake in Ga ion beam which is used in an FIB (Focused Ion Beam) apparatus used at the time of obtaining samples for TEM.

As described above, it has been confirmed that the joining surfaces of which the surface roughness and the surface area increasing ratio fall within specific ranges can be strongly jointed even in the atmospheric air pressure if some small trigger is applied in a state where they are in close contact with each other. In addition, it has also been confirmed that, with the exception of the very thin junction interface, the structures around it remain substantially unchanged before and after the joining. In other words, it has been found that an extraordinary jointed body can be obtained which has a novel near interface structure and interface structure that are different from those of the conventional jointed body.

TABLE 1

| | Members to be jointed | | | | Joining step | | | | Jointed body | | | | |
| | | | | | | | | | Near interface structure | | | | |
| | | Surface | | | | | | | Around interface structure | | | | |
| Sample No. | Pre-treatment method | Surface roughness Rmax (μm) | Surface roughness Ra (μm) | area increasing ratio ΔS0 (%) | Atmosphere | Temperature | Pressurizing (MPa) | Joining treatment (Trigger) | Treatment time (s) | Average crystal grain size dm (μm) | Average crystal grain size ds (μm) | Crystal grain sizes ratio Z = ds/dm (%) | Interface structure | Joining area ratio Δ Sb (%) |
|---|---|---|---|---|---|---|---|---|---|---|---|---|---|---|
| A1 | Nanowork | 0.096 | 0.008 | 19.8 | Air | Room temp. | 10 | Ultrasonic vibration applied | 1.5 | 22 | 18 | 81.8 | Amorphous phase | 78.5 |
| A2 | Polishing (#1200) | 4.405 | 0.279 | 26.8 | | | | | | 21 | 20 | 95.2 | — | 9.2 |
| A3 | Polishing (#2000) | 3.081 | 0.105 | 12.6 | | | | | | — | — | — | — | 7.1 |
| A4 | Polishing (Mirror surface) | 0.185 | 0.017 | 4.2 | | | | | | — | — | — | — | 5.5 |
| B1 | Degreasing | — | 0.150 | — | Air | 200~300 | 100 | Ultrasonic vibration applied | 1 | 12 | 2.5 | 20.8 | Fine crystal | — |
| C1 | Ar ion beam cleaning | — | 0.005 | — | Ultrahigh vacuum $5 \times 10^{-9}$ Pa | Room temp. | 50 | Pressurizing | 10 | — | — | — | — | — |

Contrary to the above, in cases of Samples B1 and B2, the near interface structure (in particular such as the size and orientation of grains) changed significantly before and after the joining, and the junction interface was not flat (straight line in the cross-section).

It has been found, however, that a very thin joining layer (interface structure) exists at the junction interface of Sample A1 if being observed enlargedly to nano-level. This

The invention claimed is:

1. A jointed body formed by solid-phase joining a first member to a second member, the jointed body having a junction interface between the first member and the second member, wherein an average crystal grain size in a near interface structure that constitutes a near interface area having a total width of 20 micrometers and extending at both sides of the junction interface as a center is 75-100% of an average crystal grain size in an around interface structure that constitutes around interface areas located at both outer sides of the near interface area, the around interface area is located approximate to the near interface area, and the junction interface is excluded from the width of the near interface area.

2. The jointed body as recited in claim 1, wherein an interface structure that constitutes the junction interface includes at least an amorphous oxide phase.

3. The jointed body as recited in claim 1, wherein each of the near interface structure and the around interface structure comprises a metal structure.

4. The jointed body as recited in claim 3, wherein the metal structure comprises pure aluminum (Al) or aluminum alloy.

5. The jointed body as recited in claim 1, wherein the first or second member has a joining surface that has a microasperity shape such that a surface roughness is 0.2 micrometers or less as a maximum height (Rmax) and an actual surface area (S0) is larger by 15% or more than a reference surface area (St) calculated from external dimensions.

6. The jointed body as recited in claim 5, wherein the joining surface is such that the surface roughness is 0.02 micrometers or less as a center line average roughness (Ra).

7. A method for manufacturing the jointed body as recited in claim 1, the method comprising a joining step that obtains the jointed body by solid-phase joining the first member to the second member, wherein at least one of the first member and the second member comprises a joining surface that has a microasperity shape such that a surface roughness is 0.2 micrometers or less as a maximum height (Rmax) and an actual surface area (S0) is larger by 15% or more than a reference surface area (St) calculated from external dimensions, and the joining step is a normal temperature joining step that joints the first member to the second member via the joining surface in normal temperature air.

8. The method for manufacturing the jointed body as recited in claim 7, the normal temperature joining step is a step that applies a vibration to the first member and the second member which are pressurized via the joining surface.

9. The jointed body as recited in claim 1, wherein the thickness of a joining layer is smaller than the crystal grain size of the near interface area and the around interface areas.

* * * * *